(12) United States Patent
Govari

(10) Patent No.: US 6,223,066 B1
(45) Date of Patent: Apr. 24, 2001

(54) OPTICAL POSITION SENSORS

(75) Inventor: Assaf Govari, Qiryat Haim (IL)

(73) Assignee: Biosense, Inc., New Brunswick, NJ (US)

(*) Notice: Subject to any disclaimer, the term of this patent is extended or adjusted under 35 U.S.C. 154(b) by 0 days.

(21) Appl. No.: 09/232,499

(22) Filed: Jan. 15, 1999

Related U.S. Application Data

(60) Provisional application No. 60/072,148, filed on Jan. 21, 1998.

(51) Int. Cl.$^7$ ........................................ A61B 5/05
(52) U.S. Cl. ........................................ 600/424
(58) Field of Search ........................................ 600/424

(56) References Cited

U.S. PATENT DOCUMENTS

| | | | |
|---|---|---|---|
| 3,644,825 | 2/1972 | Davis, Jr. et al. | 324/41 |
| 3,868,565 | 2/1975 | Kuipers | 324/34 R |
| 4,017,858 | 4/1977 | Kuipers | 343/100 R |
| 4,054,881 | 10/1977 | Raab | 343/112 R |
| 4,317,078 | 2/1982 | Weed et al. | 324/208 |
| 4,560,930 | 12/1985 | Kouno | 324/207 |
| 4,613,866 | 9/1986 | Blood | 343/448 |
| 4,642,786 | 2/1987 | Hansen | 364/559 |
| 4,651,436 | 3/1987 | Gaal | 33/533 |
| 4,710,708 | 12/1987 | Rorden et al. | 324/207 |
| 4,849,692 | 7/1989 | Blood | 324/208 |
| 4,869,238 | 9/1989 | Opie et al. | 128/6 |
| 4,905,698 | 3/1990 | Strohl, Jr. et al. | 128/653 R |
| 4,945,305 | 7/1990 | Blood | 324/207.17 |
| 4,982,725 | 1/1991 | Hibino et al. | 128/4 |
| 5,002,137 | 3/1991 | Dickinson et al. | 175/19 |
| 5,042,486 | 8/1991 | Pfeiler et al. | 128/653 R |
| 5,068,608 | 11/1991 | Clark, Jr. | 324/220 |
| 5,099,845 | 3/1992 | Besz et al. | 128/653.1 |
| 5,172,056 | 12/1992 | Voisin | 324/207.17 |
| 5,211,165 | 5/1993 | Dumoulin et al. | 128/653.1 |
| 5,251,635 | 10/1993 | Dumoulin et al. | 128/653.1 |
| 5,253,647 | 10/1993 | Takahashi et al. | 128/653.1 |
| 5,255,680 | 10/1993 | Darrow et al. | 128/653.1 |
| 5,265,610 | 11/1993 | Darrow et al. | 128/653.1 |

(List continued on next page.)

FOREIGN PATENT DOCUMENTS

| | | | |
|---|---|---|---|
| WO 92/03090 | 3/1992 | (WO) | A61B/5/06 |
| WO 94/04938 | 3/1994 | (WO) | G01S/3/14 |
| WO 94/23647 | 10/1994 | (WO) | A61B/5/05 |
| WO 94/28782 | 12/1994 | (WO) | A61B/1/00 |
| WO 96/05768 | 2/1996 | (WO) | A61B/5/06 |
| WO 96/41119 | 12/1996 | (WO) | G01B/7/14 |
| WO 97/29678 | 8/1997 | (WO) . | |
| WO 97/29709 | 8/1997 | (WO) | A61B/19/00 |
| WO 97/29710 | 8/1997 | (WO) | A61B/19/00 |
| WO 97/32179 | 9/1997 | (WO) | G01B/7/14 |

*Primary Examiner*—William E. Kamm
(74) *Attorney, Agent, or Firm*—Louis J. Capezzuto

(57) ABSTRACT

An elongate medical probe, having proximal and distal ends, whose position is tracked within the body of a subject includes a magnetic-field responsive optical element adjacent to the distal end, which modulates light passing therethrough responsive to an externally-applied magnetic field. The probe also includes a fiberoptic coupled to receive modulated light from the optical element and convey it to the proximal end of the probe for analysis of the modulation.

19 Claims, 4 Drawing Sheets

U.S. PATENT DOCUMENTS

| | | | |
|---|---|---|---|
| 5,269,289 | 12/1993 | Takehana et al. | 128/4 |
| 5,273,025 | 12/1993 | Sakiyama et al. | 128/6 |
| 5,309,913 | 5/1994 | Kormos et al. | 128/653.1 |
| 5,325,873 | 7/1994 | Hirschi et al. | 128/899 |
| 5,375,596 | 12/1994 | Twiss et al. | 128/653.1 |
| 5,377,678 | 1/1995 | Dumoulin et al. | 128/653.1 |
| 5,391,199 | 2/1995 | Ben-Haim et al. | 607/122 |
| 5,425,367 | 6/1995 | Shapiro et al. | 128/653.1 |
| 5,425,382 | 6/1995 | Golden et al. | 128/899 |
| 5,429,132 | 7/1995 | Guy et al. | 128/653.1 |
| 5,437,277 | 8/1995 | Dumoulin et al. | 128/653.1 |
| 5,443,489 | 8/1995 | Ben-Haim | 607/115 |
| 5,453,687 | 9/1995 | Zierdt et al. | 324/207.17 |
| 5,483,951 | 1/1996 | Frassica et al. | 600/104 |
| 5,558,091 | 9/1996 | Acker et al. | 128/653.1 |
| 5,577,502 | 11/1996 | Darrow et al. | 128/653.1 |
| 5,622,169 | 4/1997 | Golden et al. | 128/653.1 |
| 5,682,886 | 11/1997 | Delp et al. | 128/653.1 |
| 5,694,945 | 12/1997 | Ben-Haim | 128/736 |
| 5,697,377 | 12/1997 | Wittkampf | 128/696 |
| 5,715,822 | 2/1998 | Watkins et al. | 128/653.5 |
| 5,729,129 | 3/1998 | Acker et al. | 324/207.12 |
| 5,752,513 | 5/1998 | Acker et al. | 128/653.1 |
| 5,769,843 | 6/1998 | Abela et al. | 606/10 |
| 5,797,849 | 8/1998 | Vesely et al. | 600/461 |

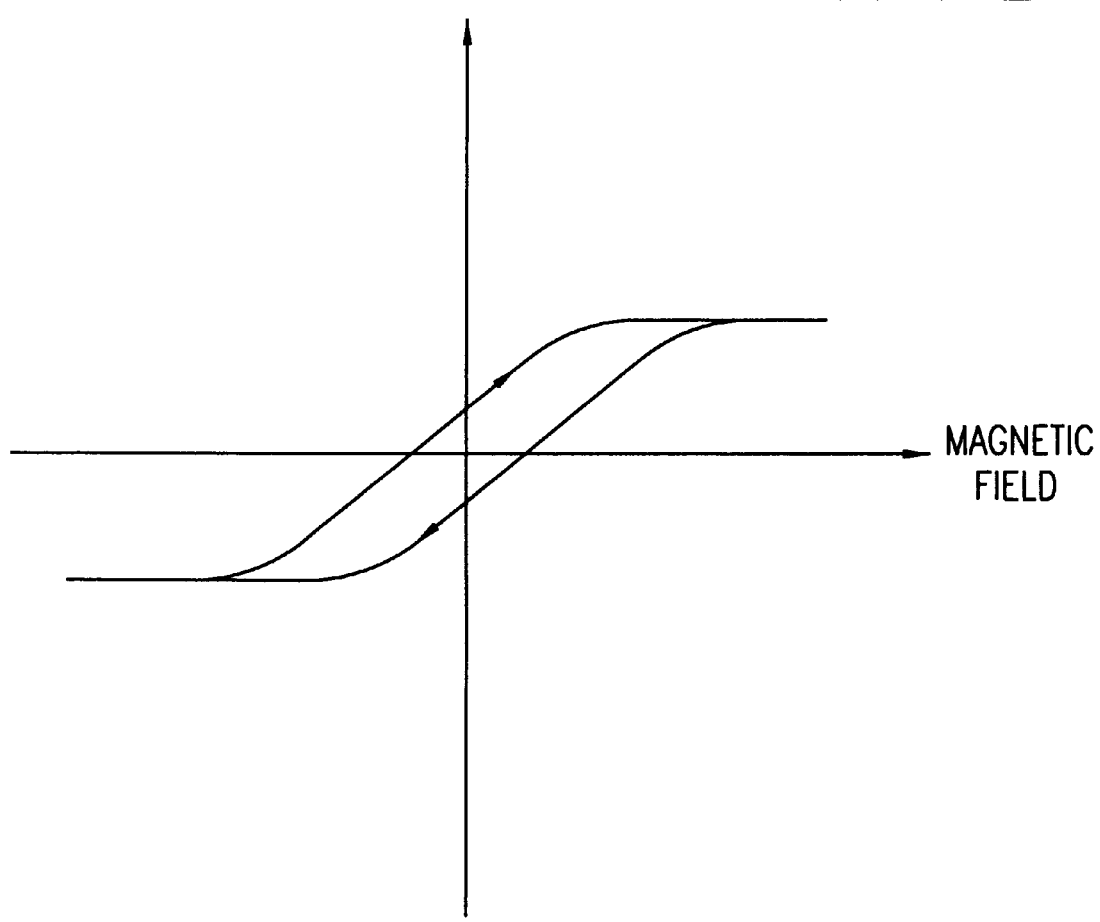

OPTICAL POSITION SENSORS

This application is a nonprovisional application of U.S. provisional application Ser. No. 60/072,148 filed Jan. 21, 1998.

FIELD OF THE INVENTION

The present invention relates generally to object tracking systems, and specifically to non-contact, electromagnetic methods and devices for tracking the position and orientation of an object.

BACKGROUND OF THE INVENTION

Non-contact methods of determining the position of an object based on generating a magnetic field and measuring its strength at the object are well known in the art. For example, U.S. Pat. No. 5,391,199, and PCT patent publication WO96/05768, which are incorporated herein by reference, describe such systems for determining the coordinates of a medical probe or catheter inside the body. These systems typically include one or more coils within the probe, generally adjacent to the distal end thereof, connected by wires to signal processing circuitry coupled to the proximal end of the probe.

U.S. Pat. No. 4,849,692, to Blood, describes a position tracking system based on detection of a DC magnetic field. Preferred embodiments described in this patent are based on detecting electrical currents generated in response to the field. Mention is made of the possibility of using a fiberoptic magnetic field sensor, but the patent gives no further information on possible implementations of such a sensor in position measurement.

The use of magneto-optic materials to measure magnetic field strength is known in the art, as described, for example, by M. N. Deeter et al., in "Novel Bulk Iron Garnets for Magneto-Optic Magnetic Field Sensing, Proceedings of SPIE, Vol. 2922, which is incorporated herein by reference. Magneto-optic materials rotate the polarization of polarized light passing through them, by an amount proportional to the strength of the magnetic field. The polarization rotation is characterized by a parameter known as Verdet's constant, expressed in units of deg/cm/Tesla. For strongly magneto-optic materials, such as yttrium iron garnet (YIG), the Verdet constant is about $10^8$. However, magneto-optic materials exhibit hysteresis, causing difficulties in field measurement when time-varying non-constant fields are involved.

Magnetostrictive fiberoptic strain gauges are also known in the art. For example, the article "Optical Fibre Magnetic Field Sensors," by K. P. Koo, Optics Letters, which is incorporated herein by reference, describes a method for measuring magnetic fields using magnetostrictive perturbation of a fiberoptic. A grating is produced within the fiber, for example by irradiating the fiber with an excimer laser. The grating generally comprises a periodically varying refractive index within the fiber. When light having a wavelength equal to twice the grating spacing is injected into the proximal end of the fiber, constructive interference of the reflected waves will give a strong reflection back to the proximal end. When a mechanical strain is applied to stretch the fiber, the grating spacing changes, so that the wavelength response of the reflected light is proportional to the mechanical strain and hence to the magnetic field.

SUMMARY OF THE INVENTION

It is an object of some aspects of the present invention to provide improved position sensing apparatus based on optical sensing of a magnetic field.

In one aspect of the present invention, the apparatus is used to determine the position of an invasive probe within the body of a patient.

In preferred embodiments of the present invention, apparatus for sensing the position of a catheter comprises an optical fiber embedded in the catheter, which senses an external magnetic field that is applied to the catheter. Light is injected into the fiber at the proximal end of the catheter and propagates down to the distal end thereof, where it is modulated by the effect of the magnetic field, as described below. The modulated light is reflected back to the proximal end, where it is monitored to provide a measure of the magnetic field at the distal end. The magnetic field measurement is used to determine coordinates of the distal end of the catheter, by methods of signal analysis similar to those described in the above-mentioned U.S. Pat. No. 5,391,199 and PCT publication WO96/05768.

In some preferred embodiments of the present invention, the fiber is coupled at its distal end to one face of a magneto-optic crystal, preferably yttrium iron garnet (YIG), suitably oriented, adjacent to the distal end of the catheter. An opposing face of the crystal is coated for reflection. Preferably, the fiber is a single-mode, polarization preserving fiber, as is known in the art. Polarized light is injected into the fiber's proximal end, and is rotated by the YIG crystal by an angle proportional to the magnetic field strength. The polarization of the reflected light returning to the proximal end is analyzed to determine the field strength, and hence, the position of the distal end of the catheter.

Alternatively, there is a polarizer placed between the distal end of the fiber and the crystal, and the intensity of the reflected light is detected to determine the polarization rotation angle. In this case, it is not necessary that the fiber be of the polarization-preserving type.

In these preferred embodiments, there is preferably an additional fiber in the catheter, not coupled to the crystal, to serve as a temperature reference. Reflection signals received from the additional fiber are used to compensate for changes in signals in the sensor fiber due to temperature changes.

Furthermore, in order to account for hysteresis in the polarization rotation effect, in preferred embodiments of the present invention, signal processing circuitry associated with the catheter preferably tracks changes of polarization of the light reflected back from the crystal, to determine where on the hysteresis curve the sensor is operating.

In other preferred embodiments of the present invention, the fiber contains a grating structure, as described in the above-mentioned article by Koo, and is clad with a magnetostrictive material. The magnetostrictive material expands or contracts in direct proportion to the external magnetic field. Such expansion or contraction changes the spacing of the grating in the fiber, so that the reflected light intensity may be used to measure the field strength and thus to determine the position of the catheter, as described above.

Preferably the magnetic field has an AC field component, at a frequency that is low enough so that the magnetostrictive material will contract and expand synchronously with the field variation. Detection of the reflected light is locked to the magnetic field AC frequency, so as to cancel out spurious changes in reflection due to other strains on the catheter, such as bending.

In some of these preferred embodiments, the fiber includes several gratings at different points along its length, each grating having a different, respective grating spacing. Polychromatic light having wavelengths corresponding respectively to the different spacings of the gratings is injected into the fiber, and changes of intensity at each wavelength are monitored to detect the magnetic field at (and hence the positions of) the different grating points along the length of the fiber. In this manner, a single fiber is used to make multiple position measurements simultaneously.

The present invention will be more fully understood from the following detailed description of the preferred embodiments thereof, taken together with the drawings in which:

BRIEF DESCRIPTION OF THE DRAWINGS

FIG. 2 is a graph showing a hysteresis curve associated with the sensor of FIG. 1A or FIG. 1B or FIG. 1C;

DETAILED DESCRIPTION OF PREFERRED EMBODIMENTS

Figure 1A:
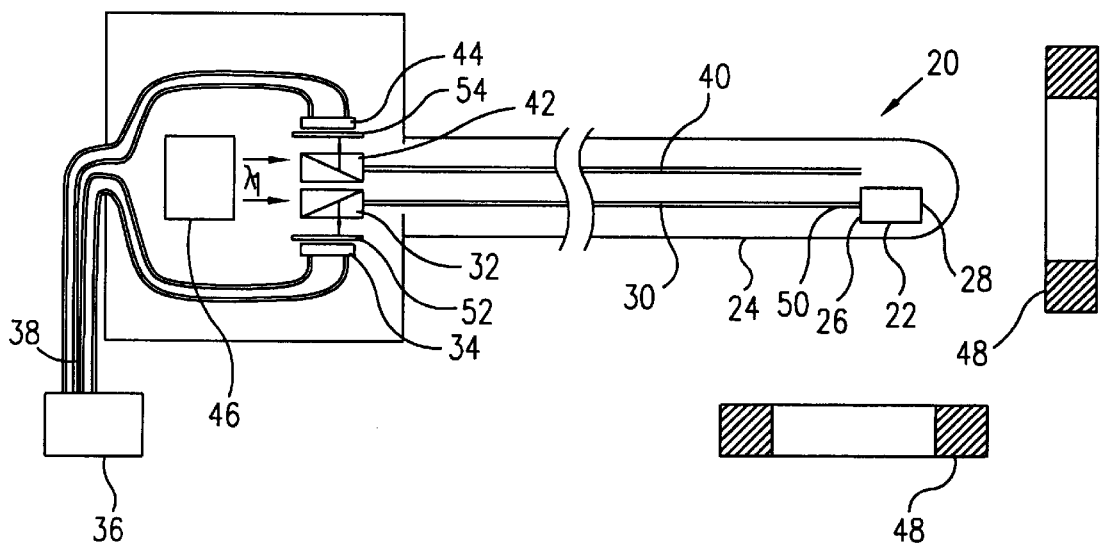
FIG. 1A is a schematic illustration showing a catheter including a fiberoptic position sensor, in accordance with a preferred embodiment of the present invention.

Reference is now made to FIG. 1A, which shows a probe 24, preferably a catheter, including a magnetic-field responsive position sensor 20, in accordance with a preferred embodiment of the present invention. Sensor 20 comprises a magneto-optic crystal 22, preferably yttrium iron garnet (YIG), and an optical fiber 30, in this case a single-mode, polarization-preserving fiber. In the preferred embodiment shown in FIG. 1A, crystal 22 has two opposing parallel faces, proximal face 26 and distal face 28, orthogonal to a symmetry axis 50 of the distal end of fiberoptic 30. Fiber 30 is connected to face 26, preferably by optical cement. Face 28 is preferably coated with a reflecting material, for example, an aluminum or dielectric coating, as is known in the art, so that light incident from the fiberoptic onto the magneto-optic material and passing through face 26 is largely reflected from face 28 back to the fiberoptic. In the presence of a magnetic field, the plane of polarization of the reflected light will be rotated by an angle proportional to the component of the magnetic field parallel to axis 50.

As shown in FIG. 1A, probe 24 is placed in the magnetic field of one, two, or more magnetic radiator coils 48, the fields of said coils preferably having been previously mapped and/or calibrated using methods known in the art. Generally the magnetic field of the radiator coils is a DC field, or an AC field, or a combination of a DC and an AC field.

In the preferred embodiment shown in FIG. 1A, polarized light having a wavelength $\lambda_1$, where $\lambda_1$ is preferably of the order of 1 μm, is injected from a source 46 into the proximal end of fiberoptic 30, preferably via a beamsplitter 32. The light traverses the fiberoptic to the distal end thereof and enters into magneto-optic crystal 22. It is reflected from face 28 through the magneto-optic crystal and the fiberoptic, back to beamsplitter 32. Beamsplitter 32 is constructed so as to direct the reflected light onto a detector 34, which measures the intensity of the reflected light. In the preferred embodiment shown in FIG. 1A, detector 34 generally comprises a polarizing element 52. It will be appreciated that the intensity of the reflected light measured by the detector is dependent on the degree of rotation of the plane of polarization caused by the magneto-optic crystal 22.

Although the intensity of the reflected light is a measure of the component of the magnetic field along axis 50 at magneto-optic crystal 22, the intensity may also be affected by temperature changes or mechanical deformation in the fiberoptic. Therefore, a second compensating fiberoptic 40, not coupled to the magneto-optical material, is fixed in the probe in proximity to fiberoptic 30, and light is injected into fiberoptic 40 as described above regarding fiberoptic 30. Light reflected from the distal end of fiberoptic 40 passes through beam splitter 42 and a polarizing element 54 to detector 44. It will be appreciated that the intensity of the reflected light measured by detector 44 is not dependent on the magnetic field acting on the magneto-optical material 22. Electrical signals from detectors 34 and 44 are fed by wires 38 to signal processing circuitry 36, which processes the signals by difference or other signal processing techniques known in the art to determine the amplitude of the magnetic field at crystal 22. As described in U.S. Pat. No. 5,391,199, the location of the sensor is derived from the amplitude of the magnetic field.

Figure 1B:
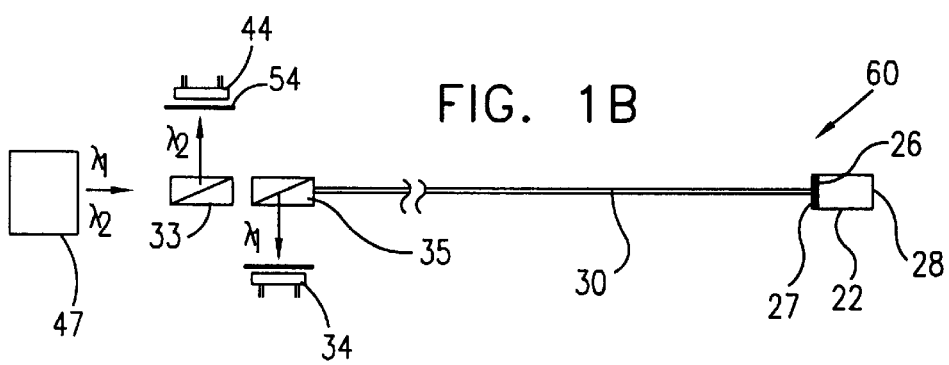
FIGS. 1B and 1C are schematic illustrations showing fiberoptic position sensors for use in the catheter of FIG. 1A, in accordance with alternative preferred embodiments of the present invention.

FIG. 1B schematically illustrates another magneto-optic position sensor 60, similarly suitable for use in probe 24, in accordance with an alternative preferred embodiment of the present invention. Apart from the differences described below, the operation of position sensor 60 is generally similar to that of position sensor 20, whereby components with the same reference numerals are generally identical in construction and operation. In the preferred embodiment shown in FIG. 1B, polarized light having a wavelength $\lambda_1$ and a reference wavelength $\lambda_2$, where $\lambda_2$ is substantially different from $\lambda_1$, is injected from a source 47 into the proximal end of fiberoptic 30, preferably via first and second dichroic beamsplitters 33 and 35. Beamsplitter 33 is designed to substantially fully transmit $\lambda_1$ and to deflect light at $\lambda_2$. Beamsplitter 35 is designed to substantially fully transmit $\lambda_2$ and to deflect light at $\lambda_1$. Beamsplitter 33 directs reflected light of wavelength $\lambda_1$ onto detector 34 via polarizer 52. Beamsplitter 35 directs reflected light of wavelength $\lambda_2$ onto detector 44 via polarizer 54. A dichroic mirror 27, which substantially transmits $\lambda_1$ and reflects $\lambda_2$, is placed between the distal end of fiberoptic 30 and proximal end 26 of crystal 22.

Thus, the intensity of the reflected light measured by detector 34 is dependent on the degree of rotation of the plane of polarization caused by the magneto-optic crystal 22, while the intensity of the reflected light measured by detector 44 is substantially independent of the magnetic field acting on magneto-optical material 22. Both intensities are substantially equally affected by temperature changes or mechanical deformation in the fiberoptic, so that the signal from detector 44 may be used as a compensating reference signal. As described above regarding sensor 20, electrical signals from detectors 34 and 44 are used to determine the amplitude of the magnetic field at crystal 22, and the location of the sensor is derived from the amplitude of the field.

Figure 1C:
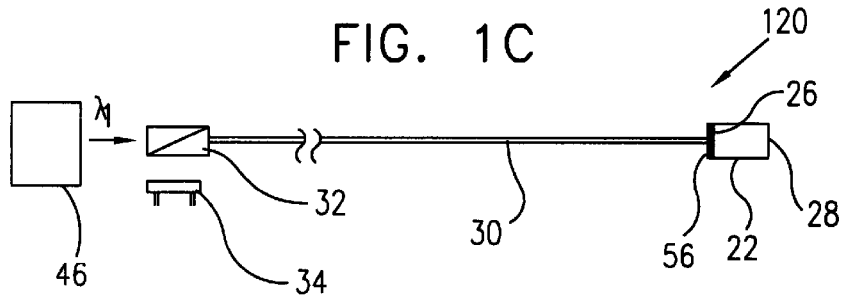

FIG. 1C schematically illustrates yet another magneto-optic position sensor 120, similarly suitable for use in probe 24, in accordance with an alternative preferred embodiment of the present invention. In sensor 120, a polarizer 56 is placed between the distal end of fiberoptic 30 and proximal face 26 of magneto-optical crystal 22. In this preferred embodiment, the light injected into the fiberoptic by source 46 is generally unpolarized, and fiberoptic 30 is not necessarily a single mode or a polarization preserving fiberoptic. Polarizer 56 thus acts as an analyzer of light reflected from face 28. The light reflected passes to beam splitter 32 and to detector 34, which generates electrical signals used to determine the amplitude of the magnetic field, as described above.

Although the preferred embodiments described above measure only a single directional component of the magnetic field, those skilled in the art will appreciate that similar sensors may be produced for measuring two or three components of the field, preferably by using a plurality of magneto-optic crystals, each with a respective fiberoptic and detector. The crystals are oriented so that each respective crystal axis is aligned along a different field axis. In a preferred embodiment of the present invention, not shown in the figures, three such crystals, in mutually substantially orthogonal orientations, may be used to measure six-dimensional position and orientation coordinates of a probe, using methods described in the above-mentioned PCT publication WO96/05768. In another preferred embodiment, three separate fiberoptics are connected to one magneto-optic crystal so as to inject into the crystal and receive therefrom three mutually substantially orthogonal beams of light, whereby the six-dimensional position and orientation coordinates are found.

In the preferred embodiments described above, the magneto-optic polarization effect of crystal 22 may be characterized by a hysteresis curve, as is shown schematically in FIG. 2. Therefore, a given polarization rotation may correspond to two different values of magnetic field strength, depending on where on the hysteresis curve the crystal is operating. Preferably, signal processing circuitry 36 tracks changes of polarization rotation in the light received by detectors, so as to compensate and correct for ambiguities due to hysteresis. Alternatively, a combination of DC and AC fields may be applied to magnetic radiator coils 48 in order to compensate for hysteresis effects, by methods known in the art, in crystal 22.

Figure 3:
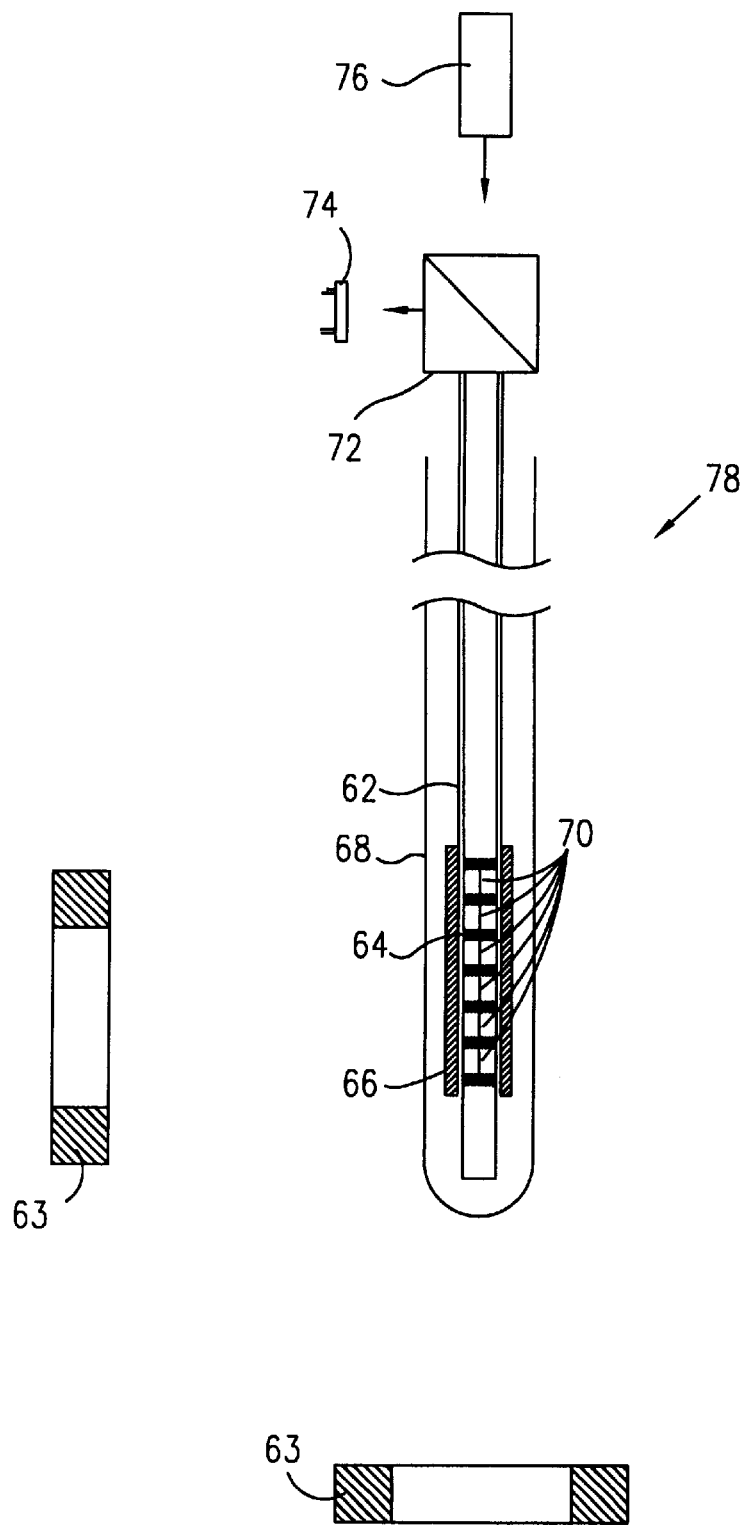
FIG. 3 is a schematic illustration showing a catheter including a fiberoptic position sensor having a magnetostrictive cladding, in accordance with a preferred embodiment of the present invention.

FIG. 3 schematically illustrates another position sensor 78 within a probe 68, in accordance with an alternative preferred embodiment of the present invention. Sensor 78 comprises a fiberoptic 62 including a grating structure 64, preferably etched into its outer surface or alternatively formed within the core of the fiberoptic, using methods known in the art. The fiberoptic is clad in the area of the grating with a magnetostrictive cladding 66, preferably nickel. The scale of the elements of sensor 78 is exaggerated in the figure for clarity of illustration.

As described above, light of wavelength $\lambda_1$ is injected into the proximal end of fiberoptic 62, generally via a beamsplitter 72 from a light source 76, which emits generally coherent light. The period of grating 64 is preferably of the order of half the wavelength $\lambda_1$ of the light injected. Magnetostrictive cladding 66 expands or contracts as a function of the external magnetic field component, parallel to grating 64, generated by magnetic radiator coils 63, thus altering the grating period. Consequently the intensity of the light at wavelength $\lambda_1$ reflected from grating 64 back to beamsplitter 72 and measured at detector 74 is a function of the magnetic field component applied along probe 68. Electrical signals from detector 44 are fed to signal processing circuitry, as shown in FIG. 1A, and the signals are processed to determine the amplitude of the magnetic field at grating 64, and thus to determine the position of probe 68.

Preferably, the magnetic field produced by coils 63 comprises an AC field, such that magnetostrictive cladding 66 contracts and expands synchronously with the field. The detection of signals from detector 74 is most preferably locked to the frequency of the AC field, so as to minimize interference due to spurious changes in reflected light intensity caused by non-magnetostrictive changes in fiberoptic parameters.

Figure 4:
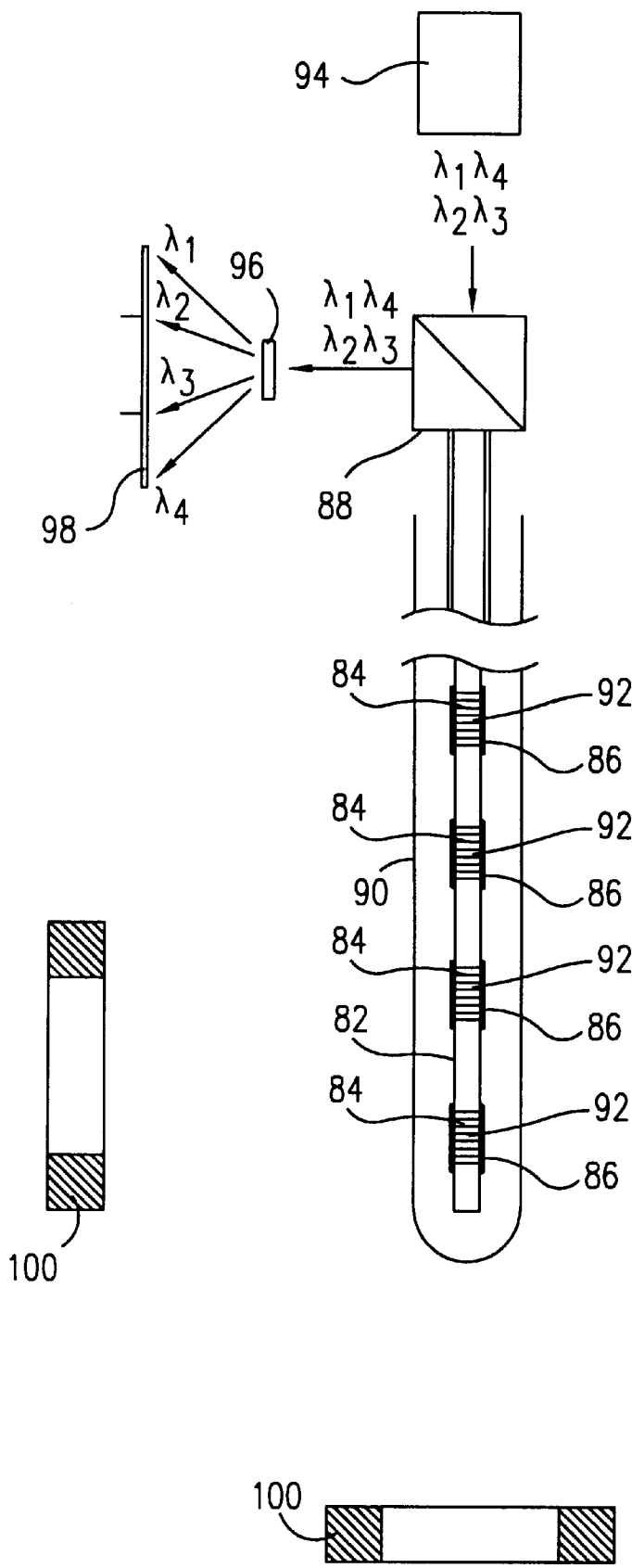
FIG. 4 is a schematic illustration showing a catheter including a single fiberoptic comprising a plurality of gratings for position sensing, in accordance with a preferred embodiment of the present invention.

FIG. 4 schematically illustrates a set of position sensors 80 within a probe 90, in accordance with a further preferred embodiment of the present invention. Sensors 80 operate in conjunction with a polychromatic light source 94, preferably a laser, emitting a plurality of substantially different coherent wavelengths $\lambda_1$, $\lambda_2$, $\lambda_3$, and $\lambda_4$. The light is injected via a broadband beamsplitter 88, or by other methods known in the art, into the proximal end of a fiberoptic 82. The fiberoptic comprises a plurality of gratings 84, formed as described above, corresponding to the plurality of injected wavelengths. Each of the gratings 84 has a substantially different grating period 92, preferably equal to half of a respective one of the plurality of wavelengths of the light injected. The wavelengths $\lambda_1$, $\lambda_2$, $\lambda_3$, and $\lambda_4$ are selected so that each grating generally reflects one of the wavelengths and largely transmits the others.

Each of gratings 84 is separately clad by a magnetostrictive cladding 86, which in the presence of a magnetic field, applied by magnetic radiator coils 100, alters the grating period as described above, and consequently changes the intensity of the light reflected from each grating. The reflected light is transferred via beamsplitter 88 to a diffraction grating 96, or other suitable wavelength-dispersive element. Grating 96 disperses the light according to wavelength onto a detector 98, most preferably a linear array detector, giving separate outputs for each of the plurality of wavelengths. As described above, the intensity of the light reflected from each of the gratings 84 and measured at detector 98 is a function of the magnetic field generated by the magnetic radiator coils at the respective grating. Electrical signals from detector 98 are fed to signal processing circuitry, as shown in FIG. 1A, and the signals are processed to determine the amplitude of the magnetic field at each grating. Thus, the respective positions of multiple points along probe 90, corresponding to multiple gratings 84, are determined.

Preferably the magnetic field in the preferred embodiment comprises an AC field, such that the magnetostrictive material contracts and expands synchronously with the field. The detection of signals from detector 98 is most preferably locked to the frequency of the AC field, as described above.

Although the preferred embodiments described above use reflection, from crystal 22 or gratings 64 or 84 back through the fiberoptic, to transfer the modulated light from the sensors to the detectors, it will be appreciated by those skilled in the art that other optical configurations can also be used to accomplish the transfer. Specifically, the modulated light from the sensors can be transferred to the detectors using transmission through the crystal or gratings.

It will be appreciated that the preferred embodiments described above are cited by way of example, and the full scope of the invention is limited only by the claims.

What is claimed is:

1. Apparatus for determining the position of an object, comprising:
   a light source;
   a magnetic-field responsive optical element, coupled to the object, which receives light from the light source and modulates the light responsive to an external AC magnetic field, having a predetermined frequency;

a detector, which receives at least a portion of the modulated light from the magnetic-field responsive optical element and generates signals responsive thereto; and signal processing circuitry, which receives the signals from the detector and processes the signals to determine the position of the object.

2. Apparatus according to claim 1, and comprising a fiberoptic which couples the light source to the optical element.

3. Apparatus according to claim 2, and comprising a reference detector which receives light that is substantially not modulated by the magnetic-field responsive element and which provides reference signals responsive thereto to the circuitry.

4. Apparatus according to claim 3, and comprising a reference fiberoptic coupled to the reference detector.

5. Apparatus according to claim 4, wherein the light source emits light at a detection wavelength, which is modulated by the magnetic-field responsive element, and element, and a reference wavelength, which is substantially not modulated thereby, and wherein the reference detector receives the light at the reference wavelength and provides the reference signal responsive thereto.

6. Apparatus according to claim 5, wherein the fiberoptic comprises a polarization preserving fiberoptic.

7. Apparatus according to claim 2 wherein the magnetic-field responsive optical element comprises a magneto-optic crystal.

8. Apparatus according to claim 7, and comprising a polarizing element for analyzing polarization rotation of the light by the magneto-optic crystal.

9. Apparatus according to claim 1, and comprising a magnetic field generator, which generates the external AC magnetic field together with a DC magnetic field.

10. Apparatus according to claim 1, wherein the signal processing circuitry processes the signals to measure a modulation thereof at the predetermined frequency.

11. Apparatus according to claim 1, wherein the signal processing circuitry tracks and records hysteresis of the magnetic-field responsive element.

12. Apparatus according to claim 1, wherein the object comprises a catheter inserted into the body of a subject.

13. A method for determining the position of an object, comprising:

fixing a magnetic field-responsive optical element to the object;

injecting light into the magnetic field-responsive optical element;

applying a modulated magnetic field to the object;

receiving light from the magnetic field-responsive optical element and detecting a modulation in the light responsive to the magnetic field;

analyzing the modulation to determine the position of the object.

14. A method according to claim 13, wherein fixing the magnetic field-responsive element to the object comprises fixing a magneto-optic material to the object.

15. A method according to claim 14, wherein injecting light into the magnetic field-responsive element comprises injecting polarized light into the magnetic field-responsive element.

16. A method according to claim 15, wherein detecting the modulation in the light comprises analyzing a polarization rotation of the light due to the material.

17. A method according to claims 16, wherein injecting light into the magnetic field-responsive element comprises coupling a light source to the magnetic field-responsive element with a fiberoptic.

18. An elongate medical probe, having proximal and distal ends, whose position is tracked within the body of a subject, comprising:

a magnetic-field responsive optical element adjacent to the distal end, which modulates light passing therethrough responsive to an externally-applied magnetic field; and a fiberoptic coupled to receive modulated light from the optical element and convey it to the proximal end of the probe for analysis of the modulation.

19. A probe according to claim 18, wherein the optical element comprises a magneto-optical crystal.

* * * * *